(12) United States Patent
Nakazawa et al.

(10) Patent No.: US 12,377,773 B2
(45) Date of Patent: Aug. 5, 2025

(54) LIGHTING CONTROL APPARATUS

(71) Applicant: KOITO MANUFACTURING CO., LTD., Tokyo (JP)

(72) Inventors: Yuichi Nakazawa, Shizuoka (JP); Ryosuke Utsumi, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 30 days.

(21) Appl. No.: 18/288,964

(22) PCT Filed: Apr. 11, 2022

(86) PCT No.: PCT/JP2022/017476
§ 371 (c)(1),
(2) Date: Oct. 30, 2023

(87) PCT Pub. No.: WO2022/230645
PCT Pub. Date: Nov. 3, 2022

(65) Prior Publication Data
US 2024/0198893 A1  Jun. 20, 2024

(30) Foreign Application Priority Data

Apr. 30, 2021 (JP) ................................ 2021-077428
Apr. 30, 2021 (JP) ................................ 2021-077429

(51) Int. Cl.
*B60Q 1/14* (2006.01)
*H05B 45/3725* (2020.01)
(Continued)

(52) U.S. Cl.
CPC ....... *B60Q 1/1453* (2013.01); *H05B 45/3725* (2020.01); *H05B 45/375* (2020.01); *H05B 45/38* (2020.01); *H05B 45/48* (2020.01)

(58) Field of Classification Search
CPC .............. B60Q 1/1453; H05B 45/3725; H05B 45/375; H05B 45/38; H05B 45/48; H05K 9/0026; H05K 5/0047
See application file for complete search history.

(56) References Cited

U.S. PATENT DOCUMENTS 6,320,762 B1    11/2001  Chen et al.
2012/0262432 A1*  10/2012  Kamata ................. H05B 45/60
                                                          345/204
(Continued)

FOREIGN PATENT DOCUMENTS

CN      104518682 A  *  4/2015  ........... B60Q 1/0094
JP      2012-113832 A   6/2012
(Continued)

OTHER PUBLICATIONS

The partial supplementary European search report issued in corresponding European Patent Application No. 22795560.6, mailed on Oct. 29, 2024 (16 pages).
(Continued)

*Primary Examiner* — Abdullah A Riyami
*Assistant Examiner* — Syed M Kaiser
(74) *Attorney, Agent, or Firm* — Osha Bergman Watanabe & Burton LLP

(57) ABSTRACT

A lighting control apparatus is configured to be applied to a vehicle lamp. The lighting control apparatus includes a first switching converter, a substrate on which the first switching converter is provided, and a first cover. The first switching converter includes a switching element, a coil, and a first output capacitor and is configured to generate a first drive voltage corresponding to a first light source of the vehicle lamp based on a power source voltage. The first cover is formed of a conductive material and covers at least a part of components of the first switching converter in one surface of the substrate. The substrate includes a first conduction part
(Continued)

and a second conduction part which are in conductive contact with the first cover. The first switching converter is provided between the first conduction part and the second conduction part. The first output capacitor is provided in a vicinity of one part of the first conduction part and the second conduction part.

14 Claims, 8 Drawing Sheets

(51) Int. Cl.
*H05B 45/375* (2020.01)
*H05B 45/38* (2020.01)
*H05B 45/48* (2020.01)

(56) References Cited

U.S. PATENT DOCUMENTS

| | | |
|---|---|---|
| 2014/0112015 A1 | 4/2014 | Kurebayashi et al. |
| 2014/0203705 A1 | 7/2014 | Ohmura et al. |
| 2015/0305109 A1 * | 10/2015 | Lee .................. H05B 45/39 |
| | | 315/297 |
| 2016/0181940 A1 | 6/2016 | Takahashi et al. |
| 2018/0339641 A1 | 11/2018 | Matsui et al. |
| 2019/0180930 A1 | 6/2019 | Yazaki |
| 2019/0223318 A1 | 7/2019 | Inoue et al. |

FOREIGN PATENT DOCUMENTS

| | | | |
|---|---|---|---|
| JP | 2014-082147 A | 5/2014 | |
| JP | 2018-198173 A | 12/2018 | |
| JP | 2019-125443 A | 7/2019 | |
| JP | 2019125433 A * | 7/2019 | ............ F21S 41/00 |
| KR | 20200112198 A * | 10/2020 | ........... B60Q 1/0088 |
| WO | WO-2018055979 A1 * | 3/2018 | ............ H01F 27/36 |

OTHER PUBLICATIONS

International Search Report in corresponding International Application No. PCT/JP2022/017476, dated May 31, 2022 (5 pages).
Written Opinion in corresponding International Application PCT/JP2022/017476, dated May 31, 2022 (5 pages).

* cited by examiner

LIGHTING CONTROL APPARATUS

TECHNICAL FIELD

The present disclosure relates to a lighting control apparatus.

BACKGROUND ART

As a lighting control apparatus applied to a vehicle lamp, there has been known a lighting control apparatus in which a lighting circuit (switching converter) that generates an output voltage (drive voltage) corresponding to a light source by boosting or stepping down a DC input voltage (a source voltage) is provided on a substrate (for example, see Patent Literature 1).

As a lighting control apparatus applied to a vehicle lamp, there has been also known a lighting control apparatus in which a circuit (a lighting circuit) including electronic components, and a connector for supplying power from the lighting circuit to a light source of a vehicle lamp are provided on a substrate. (For example, see Patent Literature 2).

CITATION LIST

Patent Literature

Patent Literature 1: JP2018-198173A
Patent Literature 2: JP2014-82147A

SUMMARY OF INVENTION

Technical Problem

However, in general, a switching converter having a larger drive capability (power consumption) tends to generate more noise. Therefore, when a switching converter having a large power consumption is provided on a substrate, it is difficult to reduce an influence of noise.

Meanwhile, in a case where the connector as described above is provided on the substrate, when a longitudinal direction of the connector is provided in parallel to a region (input region) to which an input signal is input, a pattern length of a wiring connecting the circuit and the connector becomes larger, and it is difficult to route the wiring and reduce a size of the substrate.

The present disclosure has been made in view of the technical problems as described above, and a first object is to provide a lighting control apparatus capable of reducing noise. Further, a second object is to provide a lighting control apparatus capable of improving wiring efficiency and reducing a substrate size.

Solution to Problem

An aspect of the present disclosure for achieving the first object provides a lighting control apparatus configured to be applied to a vehicle lamp. The lighting control apparatus includes: a first switching converter which includes a switching element, a coil, and a first output capacitor and is configured to generate a first drive voltage corresponding to a first light source of the vehicle lamp based on a power source voltage; a substrate on which the first switching converter is provided; and a first cover which is formed of a conductive material and covers at least a part of components of the first switching converter in one surface of the substrate. The substrate includes a first conduction part and a second conduction part which are in conductive contact with the first cover. The first switching converter is provided between the first conduction part and the second conduction part. The first output capacitor is provided in a vicinity of one part of the first conduction part and the second conduction part.

An aspect of the present disclosure for achieving the second object provides a lighting control apparatus configured to be applied to a vehicle lamp. The lighting control apparatus includes: a substrate which has a substantially quadrilateral shape; a first connector which is provided on the substrate and configured to supply power to a light source used in the vehicle lamp; and an input region which is provided on the substrate along a predetermined side of the substrate and to which a second connector configured to receive an input signal from a vehicle can be attached. The first connector has a longitudinal direction intersecting the input region and a transverse direction. A plurality of connection terminals are provided along the longitudinal direction on both outer sides of the first connector in the transverse direction.

Advantageous Effects of Invention

According to the present disclosure, it is possible to provide a lighting control apparatus capable of reducing noise. Further, according to the present disclosure, it is possible to provide a lighting control apparatus capable of improving wiring efficiency and reducing a substrate size.

DESCRIPTION OF EMBODIMENTS

At least the following matters will be clear based on the description of the present specification and accompanying drawings.

EMBODIMENT

<<System Configuration>>

Figure 1:
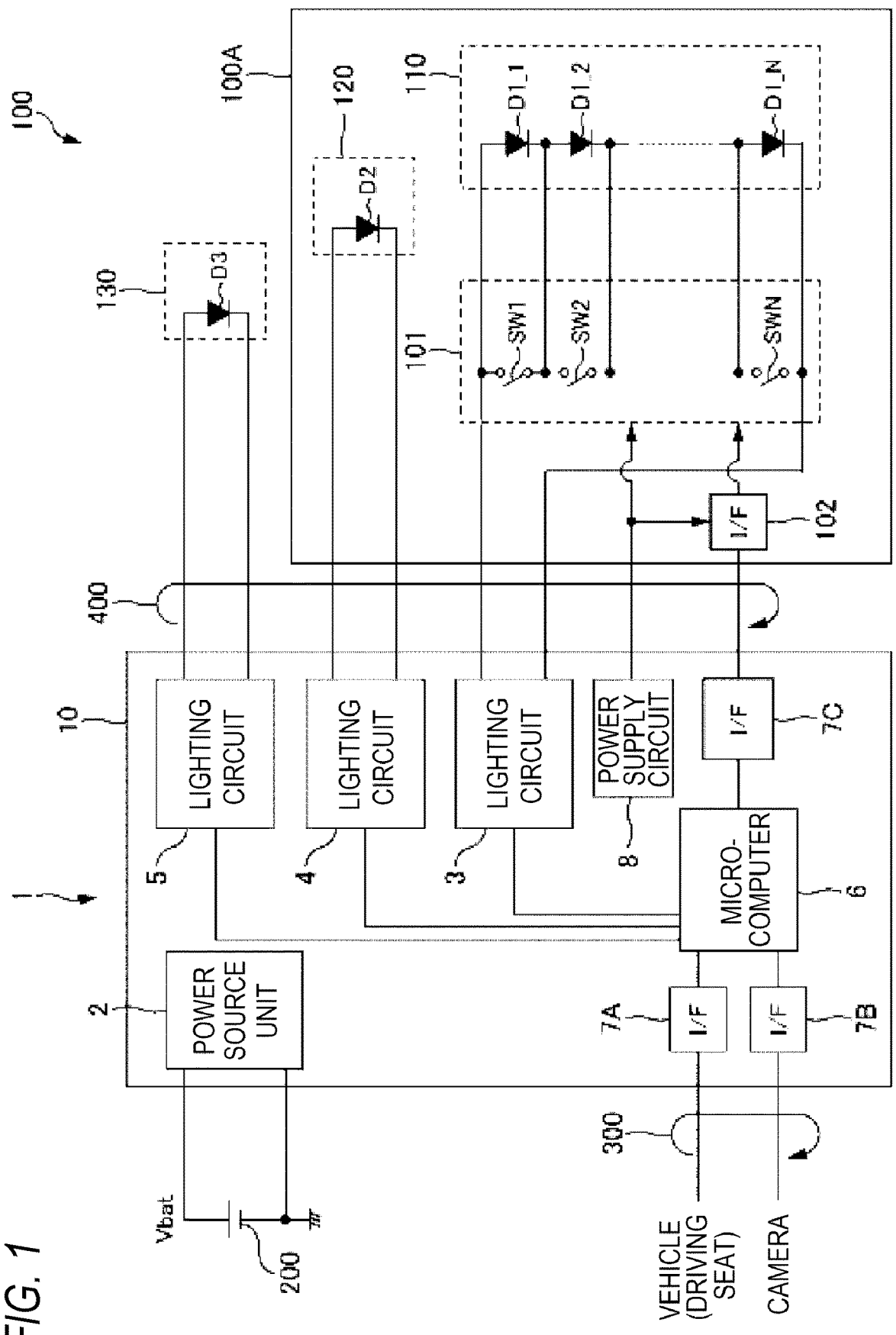
FIG. 1 is a block diagram showing an example of a system configuration including a lighting control apparatus 1 according to the present embodiment.

FIG. 1 is a block diagram showing an example of a system configuration including a lighting control apparatus 1 according to the present embodiment.

The lighting control apparatus 1 according to the present embodiment is an apparatus which is applied to a vehicle lamp 100 and controls lighting of each light source (described later) of the vehicle lamp 100.

An input signal from a vehicle side is input to the lighting control apparatus 1 via a vehicle-side harness 300. A power line of a power source voltage Vbat and a ground line of a ground level voltage from a battery 200 for a vehicle are input to the lighting control apparatus 1. In the lighting control apparatus 1, a grounded portion refers to a portion which is connected to the ground line of the battery 200. The lighting control apparatus 1 is connected to light sources of the vehicle lamp 100 via a lamp-side harness 400.

Before describing the lighting control apparatus 1, the vehicle lamp 100 will be described.

The vehicle lamp 100 according to the present embodiment is, for example, a headlight provided at a front end portion of the vehicle, and includes a plurality of (here, three) light sources (light sources 110, 120, and 130). In the present embodiment, the light source 110 corresponds to a "first light source" or a "first light emission unit", the light source 120 corresponds to a "second light source" or a "second light emission unit", and the light source 130 corresponds to a "third light source" or a "third light emission unit". It is noted that the light source 110 and the light source 120 are integrally provided as a light source unit 100A. However, the present disclosure is not limited thereto, and the light source 110 and the light source 120 may be separately provided, or the light sources 110, 120, and 130 may be integrally provided.

The light source unit 100A includes a switch circuit 101, an interface circuit (hereinafter referred to as an I/F circuit) 102, the light source 110, and the light source 120.

The switch circuit 101 is a circuit for switching elements to be lighted among a plurality (N) of light-emitting elements (D1_1 to D1_N) of the light source 110 (described later), and includes a plurality (N) of switches (SW1 to SWN).

One end of the switch SW1 is connected to a cathode of the light-emitting element D1_1, and the other end of the switch SW1 is connected to an anode of the light-emitting element D1_1. That is, the switch SW1 is connected in parallel with the light-emitting element D1_1. Similarly, the switches SW2 to SWN are connected in parallel with the light-emitting elements D1_2 to D1_N, respectively.

The I/F circuit 102 is communicably connected to an I/F circuit 7C (described later) of a substrate 10 of the lighting control apparatus 1, and receives a signal (a signal indicating an instruction from a microcomputer 6) from the I/F circuit 7C. Based on the signal, the switches (SW1 to SWN) of the switch circuit 101 are switched on and off.

The light source 110 is a high-beam light source. A high beam illuminates a front wide and distant range with a relatively high illuminance, and is mainly used when a vehicle runs at a high speed on a road where there are few oncoming vehicles or preceding vehicles. The light source 110 according to the present embodiment is an adaptive driving beam (ADB) in which the plurality of light-emitting elements D1_1 to D1_N are provided in series, and light distribution of a light distribution pattern is variably controlled by switching lighting of each light-emitting element. The ADB is a technique of recognizing a preceding vehicle, an oncoming vehicle, a pedestrian, and the like by an in-vehicle camera (imaging device), and increasing a forward field of vision of a driver at night without dazzling a driver and a pedestrian in front. In the present embodiment, each switch (SW1 to SWN) of the switch circuit 101 is controlled to be turned on and off according to the instruction from the microcomputer 6 (described later) of the lighting control apparatus 1, so that the corresponding light-emitting element is lighted.

The light source 120 is a low-beam light source and includes a light-emitting element D2. A low beam illuminates the vicinity of an own vehicle at a predetermined illuminance, has a determined light distribution regulation so as not to give glare to oncoming vehicles and preceding vehicles, and is mainly used when running in an urban area. In the present embodiment, the high-beam light source (the light source 110) is lighted together with (superimposed on) the low-beam light source (the light source 120). It is noted that in FIG. 1, the light source 120 includes one light-emitting element D2 for simplification. However, the present disclosure is not limited thereto, and for example, a plurality of light-emitting elements D2 may be connected in series.

The light source 130 has two functions of a daytime running lamp (DRL) and a clearance lamp (CLL), and includes a light-emitting element D3. The DRL is a lamp which is lighted to allow a driver of another vehicle and a pedestrian to visually recognize presence of the own vehicle more clearly during daytime, and the CLL is a lamp which is lighted to indicate a vehicle width of the own vehicle to another vehicle and a pedestrian during night-time (when the high beam and the low beam are not lighted). In the present embodiment, the DRL and the CLL are implemented by the same light source (the light source 130), and the functions thereof are implemented by modulating (changing a light emission amount of) the light-emitting element D3. It is noted that in FIG. 1, the light source 130 includes one light-emitting element D3 for simplification. However, the present disclosure is not limited thereto, and for example, a plurality of light-emitting elements D3 may be connected in series.

In the present embodiment, power consumption of the light source 110 (high beam) is larger than power consumption of the light source 120 (low beam) and power consumption of the light source 130 (DRL/CLL). In other words, the power consumption of the light source 120 and the power consumption of the light source 130 are smaller than the power consumption of the light source 110. Further, the power consumption of the light source 130 is larger during the DRL than during the CLL. According to the present embodiment, the power consumption during the DRL is equal to or less than the power consumption of the light source 120.

<<Configuration of Lighting Control Apparatus 1>>

Figure 2:
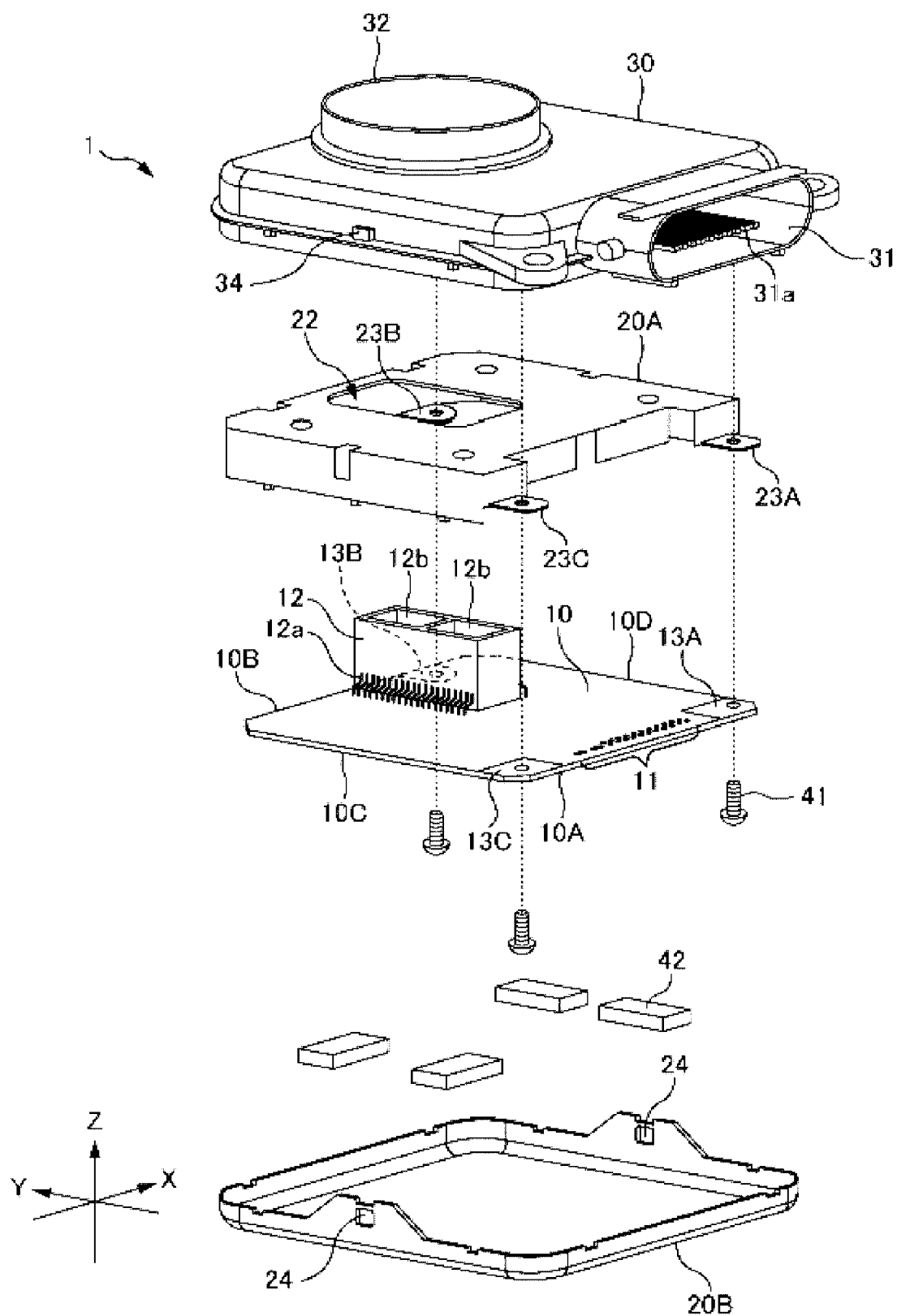
FIG. 2 is an exploded perspective view of the lighting control apparatus 1.
Figure 3:
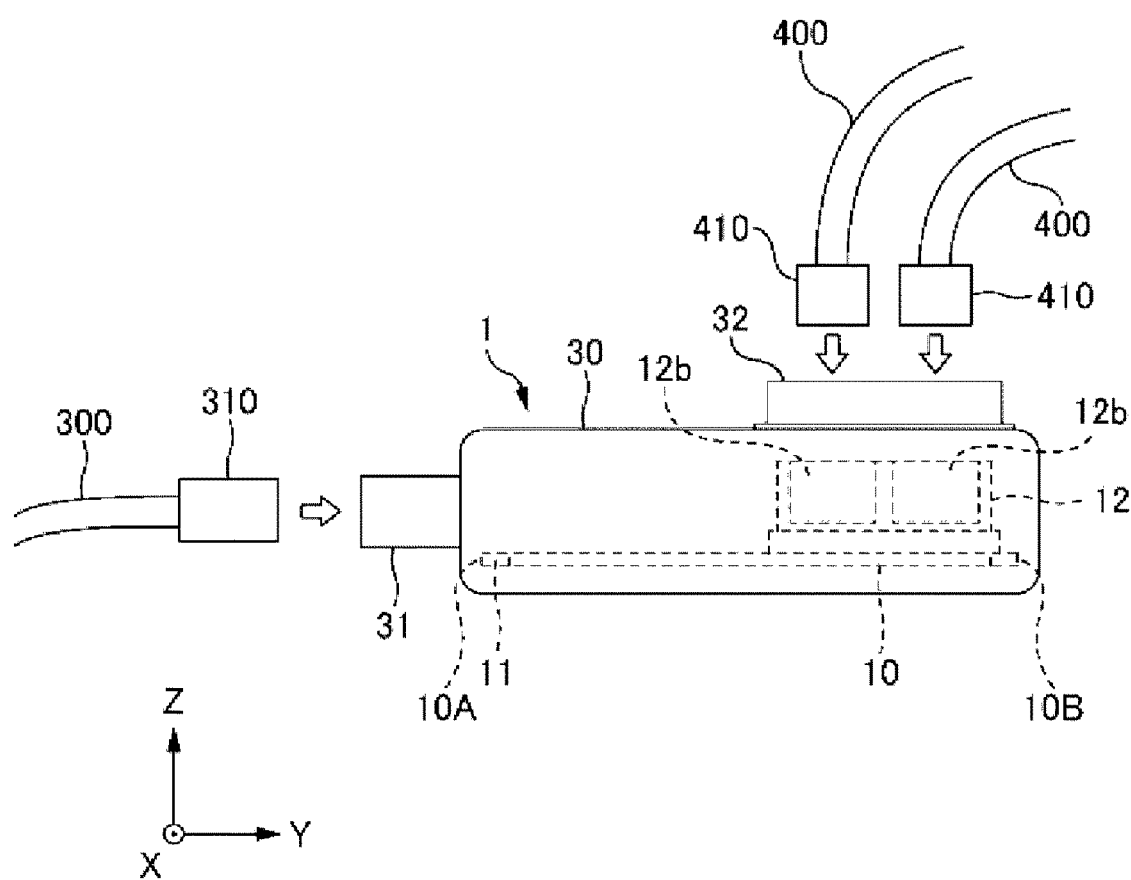
FIG. 3 is a conceptual view showing connection between the lighting control apparatus 1 and harnesses (a vehicle-side harness 300 and a lamp-side harness 400).

Next, the lighting control apparatus 1 according to the present embodiment will be described with reference to FIGS. 1, 2, and 3. FIG. 2 is an exploded perspective view of the lighting control apparatus 1. FIG. 3 is a conceptual view showing connection between the lighting control apparatus 1 and harnesses (the vehicle-side harness 300 and the lamp-side harness 400). In FIGS. 2 and 3, three directions (an X direction, a Y direction, and a Z direction) orthogonal to one another are defined. The Z direction is, for example, an up-down direction (vertical direction), the Y direction is, for example, a direction (front-rear direction) along a longitudinal direction of the vehicle, and the X direction is, for example, a direction (left-right direction) along a vehicle width. In those directions, sides indicated by arrows are plus (+) sides, and opposite sides thereof are minus (−) sides. In the following description, for example, a plus side in the X direction is referred to as a +X side and a minus side in the X direction is referred to as a −X side.

As described above, the lighting control apparatus 1 is the apparatus which controls the lighting of each light source of the vehicle lamp 100, and is attached to, for example, a bottom portion of a housing (not shown) of the vehicle lamp 100.

As shown in FIG. 2, the lighting control apparatus 1 according to the present embodiment includes the substrate 10, a cover 20A, a cover 20B, and a case 30.

<Substrate 10>

The substrate 10 is a member for mounting circuits (electronic components) constituting the lighting control apparatus 1, and is implemented as a printed wiring substrate on which circuit wirings are formed. The substrate 10 according to the present embodiment has four sides including two sides (a side 10A and a side 10B) along the X direction and two sides (a side 10C and a side 10D) along the Y direction, and has a substantially quadrilateral shape with notched corners (see FIGS. 7 and 8). It is noted that in the substrate 10 according to the present embodiment, the corners are notched in a linear shape. However, the corners are not limited thereto, and for example, may be notched in an arc shape. Alternatively, the corners of the substrate 10 may not be notched (the substrate 10 may be quadrilateral). Further, each side of the substrate 10 may have an inwardly recessed portion or an outwardly protruding portion. Among the four sides of the substrate 10 according to the present embodiment, the side 10A corresponds to a "predetermined side".

As shown in FIG. 1, the substrate 10 is provided with a power circuit 2, lighting circuits 3 to 5, the microcomputer 6, I/F circuits 7A to 7C, and a power supply circuit 8. It is noted that in FIG. 2, for convenience, the circuits (the power source circuit 2 and the like) described above are omitted.

The power source circuit 2 is a circuit which generates, based on the power source voltage Vbat of the battery 200, a drive voltage of each circuit (the microcomputer 6 and the like) provided on the substrate 10.

The lighting circuit 3 is a circuit which lights the light source 110 of the vehicle lamp 100. The lighting circuit 3 according to the present embodiment is a switching converter which generates a drive voltage corresponding to the light source 110 based on the power source voltage Vbat. The lighting circuit 3 corresponds to a "first switching converter" or a "first lighting circuit", and the drive voltage corresponding to the light source 110 corresponds to a "first drive voltage".

The lighting circuit 4 is a circuit which lights the light source 120 of the vehicle lamp 100. The lighting circuit 4 according to the present embodiment is a switching converter which generates a drive voltage corresponding to the light source 120 based on the power source voltage Vbat. The lighting circuit 4 corresponds to a "second switching converter" or a "second lighting circuit", and the drive voltage corresponding to the light source 120 corresponds to a "second drive voltage".

The lighting circuit 5 is a circuit which lights the light source 130 of the vehicle lamp 100. The lighting circuit 5 according to the present embodiment is a switching converter which generates a drive voltage corresponding to the light source 130 based on the power source voltage Vbat. The lighting circuit 5 corresponds to a "third switching converter" or a "third lighting circuit", and the drive voltage corresponding to the light source 130 corresponds to a "third drive voltage".

That is, in the lighting control apparatus 1 according to the present embodiment, the lighting circuits 3 to 5 (three switching converters) are provided on the substrate 10. The configuration examples of the lighting circuits 3 to 5 will be described later.

The microcomputer 6 is a circuit which controls an operation of each part of the lighting control apparatus 1 and the vehicle lamp 100. In the present embodiment, the microcomputer 6 corresponds to an "instruction circuit" which receives input signals from the I/F circuit 7A and the I/F circuit 7B and transmits instructions to the lighting circuits 3 to 5. Based on the instructions (in other words, the input signals), the lighting circuits 3 to 5 light the corresponding light sources, respectively.

The I/F circuit 7A is a circuit which receives the input signal from the vehicle (such as an operation unit of a driving seat) via the vehicle-side harness 300 and transmits the input signal to the microcomputer 6.

The I/F circuit 7B is a circuit which receives an input signal from an in-vehicle camera via the vehicle-side harness 300 and transmits the input signal to the microcomputer 6. Each of the I/F circuit 7A and the I/F circuit 7B corresponds to an "interface circuit" which receives the input signal from the vehicle.

The I/F circuit 7C transmits an output signal of the microcomputer 6 to the I/F circuit 102 of the light source unit 100A via the lamp-side harness 400.

The power supply circuit 8 is a circuit which supplies power for driving (operating) each circuit (the switch circuit 101 and the I/F circuit 102) of the light source unit 100A to the light source unit 100A.

As shown in FIG. 2, the substrate 10 is provided with an input region 11, an output connector 12, and ground portions 13A, 13B, and 13C.

The input region 11 is a region where a plurality of input terminals (holes) of the substrate 10 are provided, and is a region into which input signals are input to the substrate 10. In the present embodiment, the input region 11 is provided along the X direction in the vicinity of the side 10A of the substrate 10. An input connector 31 of the case 30 (described later) can be attached to the input region 11.

The output connector 12 includes a plurality of connection terminals 12a and two connection units 12b.

The connection terminals 12a are terminals for electrically connecting to the circuits (electronic components) provided on the substrate 10, and the plurality of the connection terminals 12a are provided along a longitudinal direction (here, the Y direction) on both outer sides of the output connector 12 in a transverse direction (here, the X direction).

The connection unit 12b is a unit to be engaged with a connector 410 of the lamp-side harness 400. When the connector 410 is fitted into the connection unit 12b of the output connector 12, the output connector 12 and the lamp-side harness 400 are electrically connected. It is noted that the output connector 12 according to the present embodiment includes the two connection units 12b provided side by side in the Y direction, so that two connectors 410 can be connected. However, the present disclosure is not limited thereto. For example, one connector 410 may be connected to only one connection unit 12b.

The ground portions 13A, 13B, and 13C are parts coming into conductive contact with the cover 20A. Through holes are formed in the ground portions 13A, 13B, and 13C, respectively, and a conductor connected to the ground (the ground line) is exposed from a surface (a substrate surface around each through hole). When the substrate 10 and the cover 20A are fastened to the case 30 by screws 41, the ground portions 13A, 13B, and 13C come into conductive contact with the cover 20A. Specifically, the ground portion 13A comes into conductive contact with a connection piece 23A of the cover 20A, the ground portion 13B comes into conductive contact with a connection piece 23B of the cover 20A, and the ground portion 13C comes into conductive contact with a connection piece 23C of the cover 20A. The ground portion 13B corresponds to "one part of a first conduction part and a second conduction part", and the ground portion 13A is the "other part of the first conduction part and the second conduction part". Further, the ground portion 13C corresponds to a "third conduction part".

<Cover 20A>

The cover 20A is a noise shielding member which reduces or prevents leakage of electromagnetic noise generated from the circuit components provided on the substrate 10 and shields electromagnetic noise entering from an outside, and is formed of a conductive material (for example, a metal such as aluminum). The cover 20A is a box-shaped member having a substantially quadrilateral shape corresponding to the substrate 10 in a plan view and open on a −Z side, and is placed on a +Z side of the substrate 10 and accommodated in the case 30.

The cover 20A includes an opening 22 and the connection pieces 23A, 23B, and 23C.

The opening 22 is a portion (opening) through which the output connector 12 of the substrate 10 is inserted when the substrate 10 is attached to the case 30 together with the cover 20A. Therefore, the opening 22 is formed at a position and in a shape corresponding to the output connector 12. The opening 22 allows the connector 410 of the lamp-side harness 400 to be fitted into the connection unit 12b of the output connector 12. The cover 20A according to the present embodiment covers at least a portion excluding the input region 11 and the output connector 12 in a +Z side surface of the substrate 10, and covers all components of the lighting circuits 3 to 5 provided in the +Z side surface of the substrate 10. However, the present disclosure is not limited thereto, and at least a part of the components in each of the lighting circuits 3 to 5 may be covered. The +Z side surface of the substrate 10 corresponds to "one surface", and the cover 20A corresponds to a "first cover".

The connection pieces 23A, 23B, and 23C are portions for fixing (mounting) the cover 20A to the case 30 together with the substrate 10 by the screws 41. The connection pieces 23A, 23B, and 23C are provided at positions corresponding to the ground portions 13A, 13B, and 13C of the substrate 10 to extend laterally from a side surface of the cover 20A. Further, the connection pieces 23A, 23B, and 23C are provided with through holes through which the screws 41 are inserted at positions corresponding to the through holes of the ground portions 13A, 13B, and 13C, respectively.

<Cover 20B>

Similarly to the cover 20A, the cover 20B is a noise shielding member, and is formed of a conductive material (for example, aluminum) to have a shallow box shape corresponding to the substrate 10. In the present embodiment, the cover 20B for noise shielding covers a −Z side surface of the substrate 10. Accordingly, noise can be reduced on both sides of the substrate 10 in the Z direction. The cover 20B has engagement holes 24.

The engagement holes 24 are holes for fixing the cover 20B to the case 30, and are provided at positions corresponding to engagement protrusions 34 (described later) of the case 30.

By engaging the engagement holes 24 with the engagement protrusions 34 of the case 30 in a state where the substrate 10 and the cover 20A are attached (fastened), the cover 20B is fixed to the case 30 while covering the −Z side surface of the substrate 10. Accordingly, the noise can be reduced or prevented (shielded) even on a −Z side of the substrate 10, and the noise can be further reduced. The cover 20B is fixed to the case 30 by applying an adhesive (not shown) between an outer edge of the case 30 and the cover 20B and curing the adhesive. Since the adhesive is interposed between the cover 20B and the case 30, a waterproof structure for reducing or preventing water from entering is also achieved.

The cover 20B is not accommodated in the case 30 and is exposed. Accordingly, the cover 20B also has a function of dissipating heat generated in the substrate 10 via heat transfer sheets 42. The heat transfer sheets 42 are members which are interposed between the substrate 10 and the cover 20B, transfer the heat generated in the substrate 10 to the cover 20B, and also reduce or prevent vibration.

<Case 30>

The case 30 is a housing which accommodates therein the cover 20A and the substrate 10 of the lighting control apparatus 1, and is formed of, for example, a resin. The case 30 according to the present embodiment includes the input connector 31, a cylindrical opening 32, and the engagement protrusions 34.

The input connector 31 is a connector for connecting to a connector 310 of the vehicle-side harness 300, and corresponds to a "second connector". The input connector 31 according to the present embodiment is provided on a −Y side end of the case 30. The input connector 31 is provided with a plurality of pins 31a, and the pins 31a are bent to the −Z side inside the case 30. That is, when the substrate 10 is attached to the case 30, the pins 31a are inserted into corresponding terminals (holes) of the input region 11. Then, by soldering the terminals of the input region 11 and the inserted pins 31a, respectively, the terminals of the input region 11 and the pins 31a of the input connector 31 are electrically connected, respectively. Accordingly, the input connector 31 is attached to the input region 11 of the substrate 10, and a signal (an input signal) can be input to the substrate 10 via the input connector 31 of the case 30. The input connector 31 is shaped to have a waterproof structure when the connector 310 is connected.

The cylindrical opening 32 is an opening through which the lamp-side harness 400 is inserted into the case 30, and is provided at a position corresponding to the output connector 12 of the substrate 10 and the opening 22 of the cover 20A in a +Z side surface of the case 30. The connector 410 of the lamp-side harness 400 is fitted into the connection unit 12b of the output connector 12 through the cylindrical opening 32 of the case 30. Further, an edge of the cylindrical opening 32 protrudes in a cylindrical shape toward the +Z side, and the protruded portion is fitted into, for example, a bottom portion of a housing (not shown) of the vehicle lamp 100. Accordingly, the case 30 (in other words, the lighting control apparatus 1) is attached to the housing of the vehicle lamp 100. When the lighting control apparatus 1 is attached, each portion of the lighting control apparatus 1 and a connection portion with each harness is subjected to waterproof measures by using, for example, a sealing material and an adhesive to reduce or prevent the water from entering.

The engagement protrusions 34 are protruded portions for fixing the cover 20B, and are provided on both side portions of the case 30 in the X direction to protrude outward.

<Lighting Circuits 3, 4, and 5>

As described above, the lighting circuits 3, 4, and 5 according to the present embodiment are implemented by switching converters.

Figure 4:
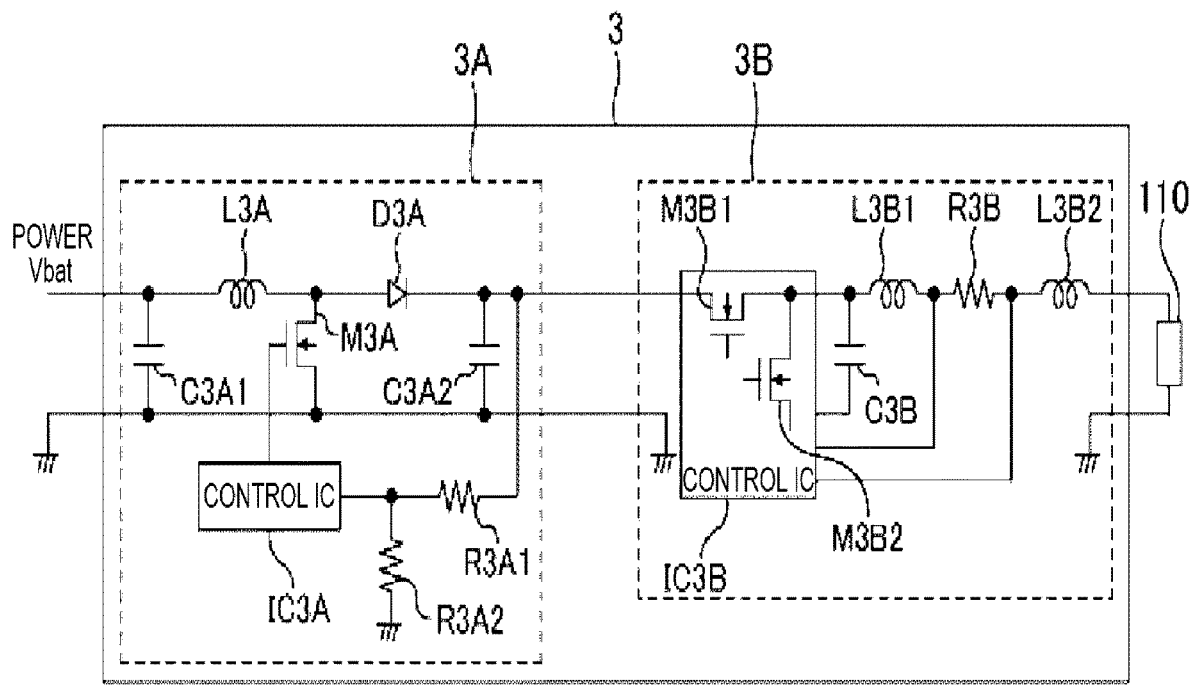
FIG. 4 is a circuit diagram showing a configuration example of a lighting circuit 3.
Figure 5:
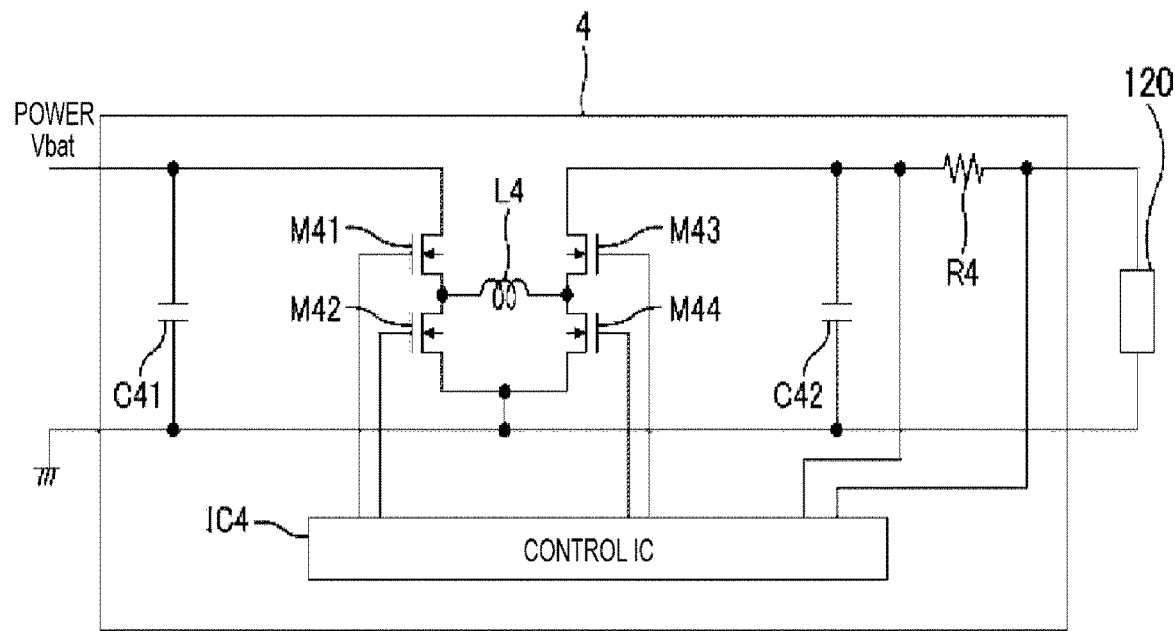
FIG. 5 is a circuit diagram showing a configuration example of a lighting circuit 4.
Figure 6:
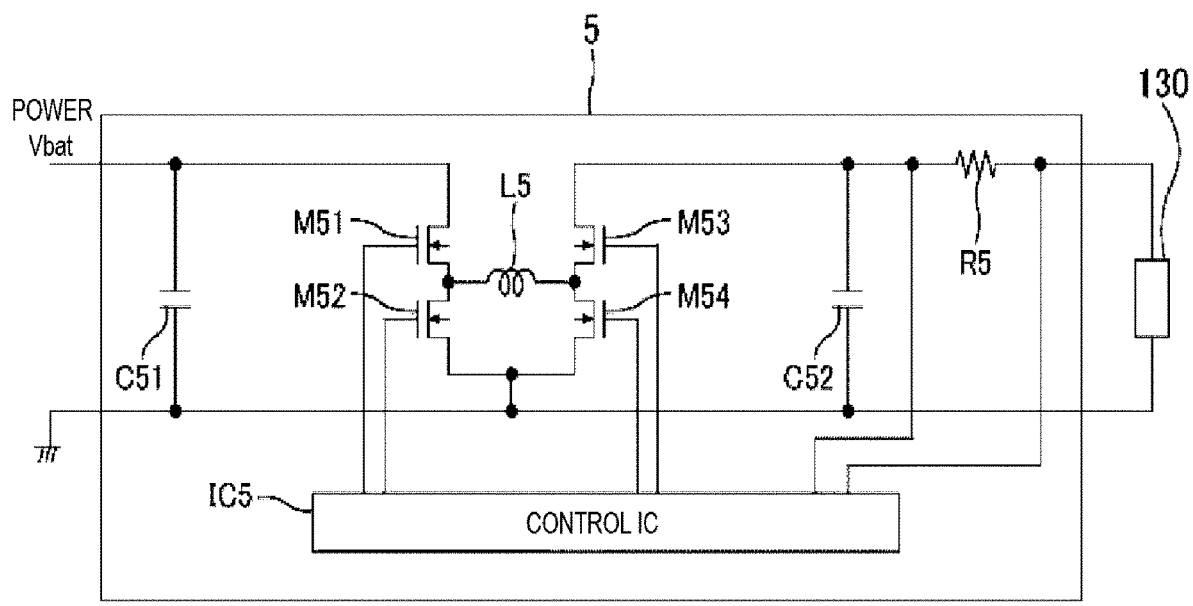
FIG. 6 is a circuit diagram showing a configuration example of a lighting circuit 5.

FIG. 4 is a circuit diagram showing the configuration example of the lighting circuit 3. FIG. 5 is a circuit diagram showing the configuration example of the lighting circuit 4. FIG. 6 is a circuit diagram showing the configuration example of the lighting circuit 5. An NMOSFET is used for each transistor (a transistor M3A and the like) in FIGS. 4 to 6.

The lighting circuit 3 is a circuit which generates the drive voltage corresponding to the light source 110 based on the power source voltage Vbat. As shown in FIG. 4, the lighting circuit 3 according to the present embodiment includes a boost circuit 3A and a step-down circuit 3B.

The boost circuit 3A is a circuit which increases the power source voltage Vbat, and includes a control circuit IC3A, capacitors C3A1 and C3A2, a coil L3A, the transistor M3A, a diode D3A, and resistors R3A1 and R3A2.

One end of the capacitor C31A1 is connected to the power source line, and the other end is connected to the ground line (grounded).

One end of the coil L3A is connected to the one end of the capacitor C3A1, and the other end of the coil L3A is connected to a drain of the transistor M3A and an anode of the diode D3A.

A source of the transistor M3A is grounded, and a signal from the control circuit IC3A is input into a gate of the transistor M3A.

A cathode of the diode D3A is connected to one end of the capacitor C3A2, and the other end of the capacitor C3A2 is grounded. A voltage at a connection point between the cathode of the diode D3A and the capacitor C3A2 is an output voltage of the boost circuit 3A.

The resistor R3A1 and the resistor R3A2 are connected in series and are provided in parallel with the capacitor C3A2.

The control circuit IC3A is a circuit which controls an operation of the lighting circuit 3 (here, the boost circuit 3A) based on the instruction from the microcomputer 6, and corresponds to a "first control circuit". In the present embodiment, the control circuit IC3A (and control circuits IC3B, IC4, and IC5 to be described later) is implemented by an integrated circuit (IC). Based on a divided voltage between the resistor R3A1 and the resistor R3A2 (a voltage at a connection point between the resistor R3A1 and the resistor R3A2), the control circuit IC3A controls the transistor M3A to be turned on and off such that the output voltage of the boost circuit 3A (a voltage of the capacitor C3A2) becomes a predetermined voltage.

When the transistor M3A is turned on by the control circuit IC3A, energy from power source is stored in the coil L3A. When the transistor M3A is turned off, a voltage corresponding to the energy stored in the coil L3A is superimposed on the power source voltage Vbat. Therefore, the output voltage of the boost circuit 3A is higher than the power source voltage Vbat.

The step-down circuit 3B is a circuit which steps down the output voltage of the boost circuit 3A to generate the drive voltage corresponding to the light source 110, and includes a control circuit IC3B, a capacitor C3B, coils L3B1 and L3B2, and a resistor R3B.

The control circuit IC3B controls an operation of the lighting circuit 3 (here, the step-down circuit 3B) based on an instruction from the microcomputer 6. The control circuit IC3B includes a transistor M3B1 and a transistor M3B2. Each of the transistor M3B1 and the transistor M3B2 corresponds to a "switch element".

A drain of the transistor M3B1 is connected to the one end of the capacitor C3A1 of the boost circuit 3A. That is, the output voltage of the boost circuit 3A is applied to the drain of the transistor M3B1. A source of the transistor M3B1 is connected to a drain of the transistor M3B2 and one end of the capacitor C3B, and a source of the transistor M3B2 and the other end of the capacitor C3B are grounded.

The coil L3B1, the resistor R3B, and the coil L3B2 are connected in series. One end of the coil L3B1 is connected to a connection point between the transistor M3B1, the transistor M3B2, and the capacitor C3B. In the present embodiment, the capacitor C3B corresponds to a "first output capacitor".

The control circuit IC3B controls (controls on and off) gate voltages of the transistor M3B1 and the transistor M3B2 based on a current flowing through the resistor R3B.

When the transistor M3B1 is turned on and the transistor M3B2 is turned off, an input voltage (the output voltage of the boost circuit 3A) of the step-down circuit 3B is applied to the one end of the coil L3B1. When the transistor M3B1 is turned off and the transistor M3B2 is turned on, a voltage of the ground line (a ground voltage) is applied to the one end of the coil L3B1.

By repeating the operation described above, an output voltage of the step-down circuit 3B becomes lower than the input voltage (the output voltage of the boost circuit 3A). Accordingly, the output voltage (the drive voltage) of the step-down circuit 3B is adjusted by the control circuit IC3B such that a predetermined drive current flows through the light-emitting element to be lighted among the light-emitting elements D1_1 to D1_N of the light source 110.

The lighting circuit 4 is a circuit which generates the drive voltage corresponding to the light source 120 based on the power source voltage Vbat. As shown in FIG. 5, the lighting circuit 4 has a configuration of a so-called H-bridge type switching converter, and includes transistors M41, M42, M43, and M44, a coil L4, capacitors C41 and C42, a resistor R15, and a control circuit IC4.

One end of the capacitor C41 is connected to the power source line, and the other end of the capacitor C41 is connected to the ground line (grounded).

A drain of the transistor M41 is connected to one end of the capacitor C41, and a source of the transistor M41 is connected to a drain of the transistor M42 and one end of the coil L4.

The other end of the coil L4 is connected to a source of the transistor M43 and a drain of the transistor M44. A source of the transistor M42 and a source of the transistor M44 are grounded.

One end of the capacitor C42 is connected to a drain of the transistor M43, and the other end of the capacitor C42 is grounded. A voltage at the one end of the capacitor C42 is output via the resistor R4. In the present embodiment, the capacitor C42 corresponds to a "second output capacitor".

The control circuit IC4 is a circuit which controls an operation of the lighting circuit 4 based on an instruction from the microcomputer 6, and corresponds to a "second control circuit". The control circuit IC4 controls on and off of the transistors (the transistors M41, M42, M43, and M44) such that a current flowing through the resistor R4 (in other words, the light-emitting element D2 of the light source 120) becomes a target value (a predetermined drive current).

An operation of such an H-bridge type circuit is known. A brief explanation of the operation is that, by fixing the transistor M43 to be turned on and the transistor M44 to be turned off and controlling on and off of the transistors M41 and M42, power can be supplied from an input side to an output side while being stepped down (a step-down mode).

Further, by fixing the transistor M41 to be turned on and the transistor M42 to be turned off and controlling on and off of the transistors M43 and M44, power can be supplied from the input side to the output side while being boosted (a boost mode).

By performing the step-down mode or the boost mode in this manner, it is possible to generate the drive voltage according to a load (here, the light source 120) based on the power source voltage Vbat.

The lighting circuit 5 is a circuit which generates the drive voltage corresponding to the light source 130 based on the power voltage Vbat. As shown in FIG. 6, the lighting circuit 5 also has a configuration of an H-bridge type switching converter, and includes transistors M51, M52, M53, and M54, a coil L5, capacitors C51 and C52, a resistor R5, and a control circuit IC5. The control circuit IC5 is a circuit which controls an operation of the lighting circuit 5 based on an instruction from the microcomputer 6, and corresponds to a "third control circuit".

A configuration and an operation of the lighting circuit 5 are the same as those of the lighting circuit 4, and description thereof is omitted.

<<Arrangement of Components on Substrate 10>>

Figure 7:
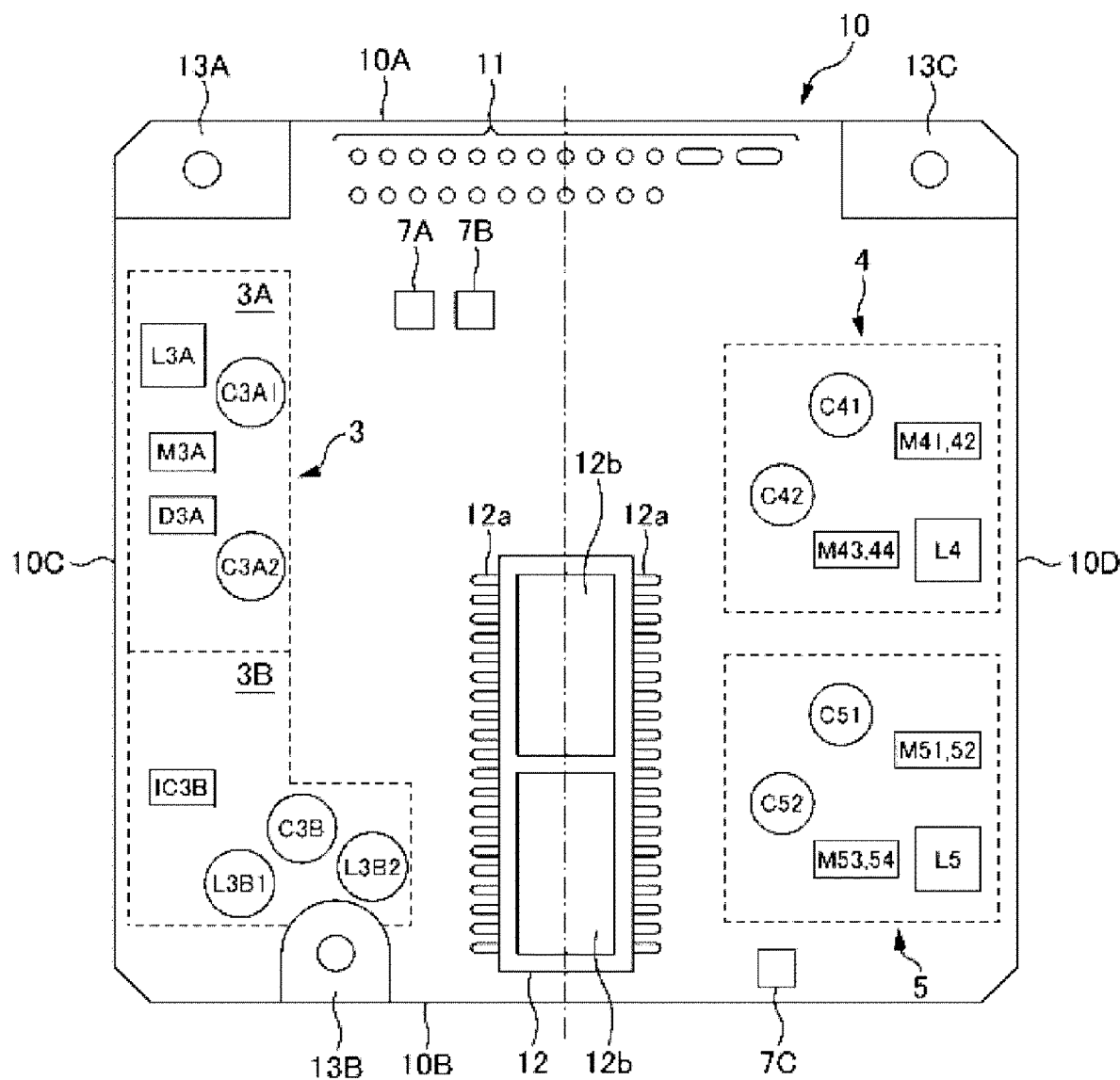
FIG. 7 is an explanatory view of arrangement of components and the like on a +Z side surface of a substrate 10.
Figure 8:
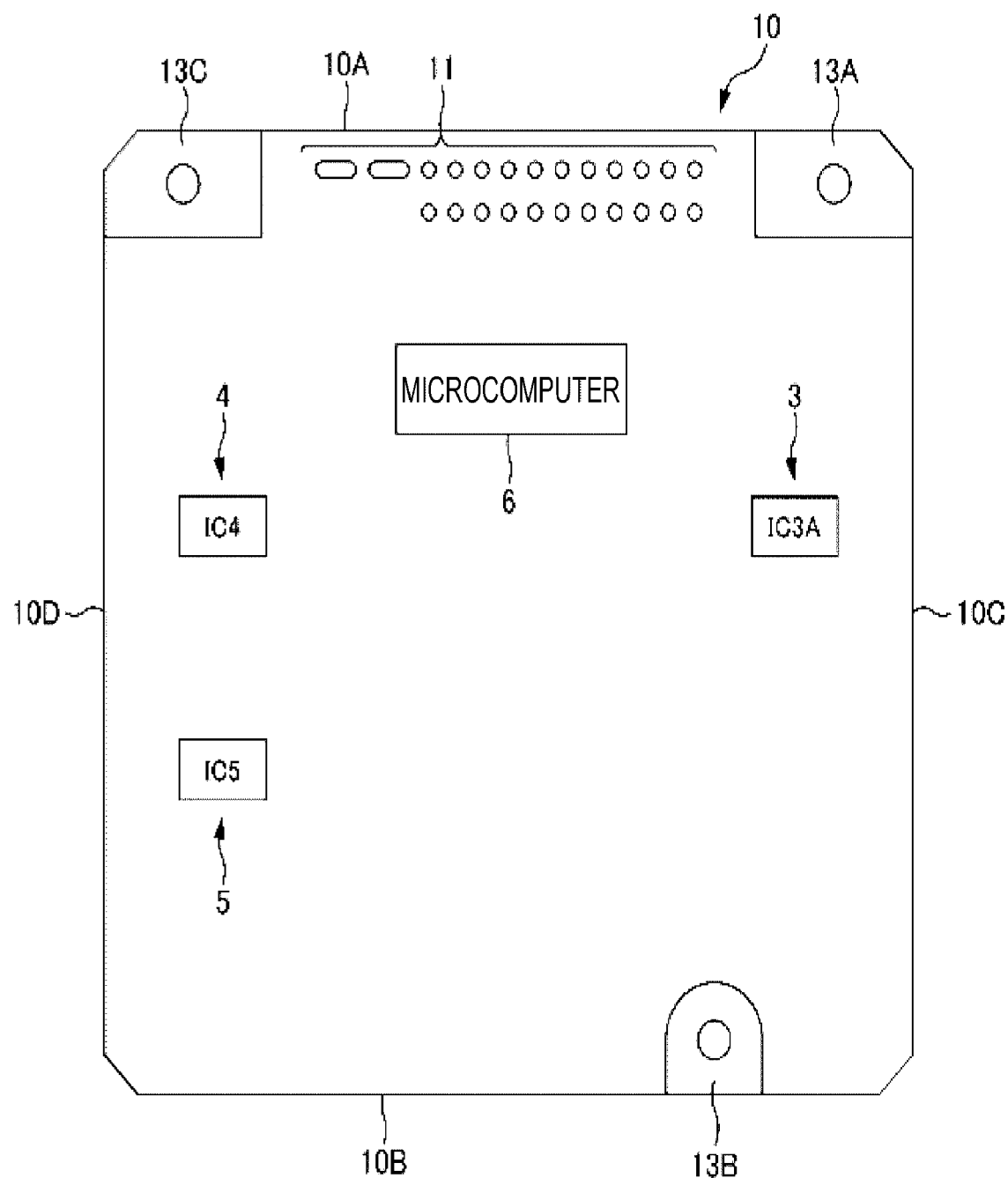
FIG. 8 is an explanatory view of arrangement of components and the like on a −Z side surface of the substrate 10.

FIG. 7 is an explanatory view of an arrangement example of components and the like in the +Z side surface of the substrate 10. FIG. 8 is an explanatory view of an arrangement example of components and the like in the −Z side surface of the substrate 10.

The substrate 10 according to the present embodiment is a substrate having a substantially quadrilateral shape as described above, and is provided with the input region 11, the output connector 12, and the ground portions 13A, 13B, and 13C. In FIG. 7, a dashed-and-dotted line indicates an axis along the Y direction passing through a middle point of the output connector 12 in the transverse direction. In the present embodiment, a middle point of the side 10A of the substrate 10 is located on the axis (the dashed-and-dotted line). In the present embodiment, the X direction corresponds to a "predetermined direction".

The ground portion 13A is provided at a corner portion between the side 10A and the side 10D of the substrate 10 (on the +X side relative to the dashed-and-dotted line), and the ground portion 13B is provided on the side 10B on the +X side relative to the dashed-and-dotted line. The ground portion 13C is provided at a corner portion between the side 10C and the side 10A (on the −X side relative to the dashed-and-dotted line). The input region 11 is provided along the X direction in the vicinity of the side 10A.

As shown in FIGS. 7 and 8, the electronic components of the circuits constituting the lighting control apparatus 1 are mounted on the substrate 10.

<Arrangement of Lighting Circuits 3, 4, and 5>

In the present embodiment, three lighting circuits (the lighting circuits 3, 4, and 5) are provided on the same substrate 10. Each of the lighting circuits 3, 4, and 5 is implemented by a switching converter including a transistor (a switching element), a coil, and a capacitor. Such a switching converter tends to generate more electromagnetic noise than a linear regulator (a series regulator). In particular, more noise tends to be generated in an output-side circuit of the switching converter (the lighting circuit 3 in the present embodiment) having a large drive capability (power consumption). In the present embodiment, the cover 20A for noise shielding is provided to cover the +Z side surface (the lighting circuits 3 to 5) of the substrate 10. However, a sufficient noise reduction effect may not be obtained in the lighting circuit 3 having large power consumption.

Therefore, in the present embodiment, as shown in FIG. 7, the lighting circuit 3 is provided between the ground portion 13A and the ground portion 13B which are the parts of the substrate 10 coming into conductive contact with the cover 20A, and the capacitor C3B on the output side where the noise tends to be generated is provided in the vicinity of the ground portion 13B. Accordingly, the noise reduction effect can be improved, and the noise can be reduced.

In addition, the coils L3B1 and L3B2 of the lighting circuit 3 are also provided in the vicinity of the ground portion 13B. Accordingly, the noise can be further reduced.

Further, the lighting circuit 3 according to the present embodiment includes the boost circuit 3A which boosts the power source voltage Vbat and the step-down circuit 3B which steps down the output voltage of the boost circuit 3A and generates the drive voltage corresponding to the light source 110. The capacitor C3B and the coils L3B1 and L3B2 are used in the step-down circuit 3B. That is, by providing the capacitor C3B and the coils L3B1 and L3B2 of the step-down circuit 3B in the vicinity of the ground portion 13B in this manner, the noise can be efficiently reduced.

In the present embodiment, the vicinity of the ground portion 13B is a range shorter than a distance from the ground portion 13B to the control circuit IC3B (the transistors M3B1 and M3B2 in the control circuit IC3B) of the step-down circuit 3B. By providing the capacitor C3B and the coils L3B1 and L3B2 of the lighting circuit 3 within the range, the noise reduction effect can be improved.

In the present embodiment, the ground portion 13A, the ground portion 13B, and the lighting circuit 3 are provided on the plus side (the +X side relative to the dashed-and-dotted line) of the substrate 10 in the X direction, and the lighting circuit 4 and the lighting circuit 5 are provided on the minus side (the −X side relative to the dashed-and-dotted line) of the substrate 10 in the X direction. Accordingly, heat generation is equalized. The plus side in the X direction corresponds to "one side in a predetermined direction", and the minus side in the X direction corresponds to "the other side in the predetermined direction".

As described above, the ground portion 13C is provided on the minus side of the substrate 10 in the X direction, and the lighting circuit 4 is provided closer to the ground portion 13C than the lighting circuit 5. As shown in FIG. 7, a distance between the capacitor C3B of the lighting circuit 3 and the ground portion 13B is shorter than a distance between the capacitor C42 on the output side of the lighting circuit 4 and the ground portion 13C. The distance between the capacitor C3B of the lighting circuit 3 and the ground portion 13B corresponds to a "first distance", and the distance between the capacitor C42 of the lighting circuit 4 and the ground portion 13C corresponds to a "second distance". Accordingly, it is possible to improve the arrangement (a degree of freedom of layout) of the lighting circuits 4 and 5 while reducing the noise.

<Arrangement of Output Connector 12>

The output connector 12 according to the present embodiment is a rectangular connector having the longitudinal direction and the transverse direction. The plurality of connection terminals 12a are provided along the longitudinal direction on both outer sides of the output connector 12 in the transverse direction.

For example, if the output connector 12 is provided on the substrate 10 such that the longitudinal direction is parallel to the side 10A, a length of a wiring pattern may become larger and it may be difficult to reduce a size of the substrate 10.

Figure 9:
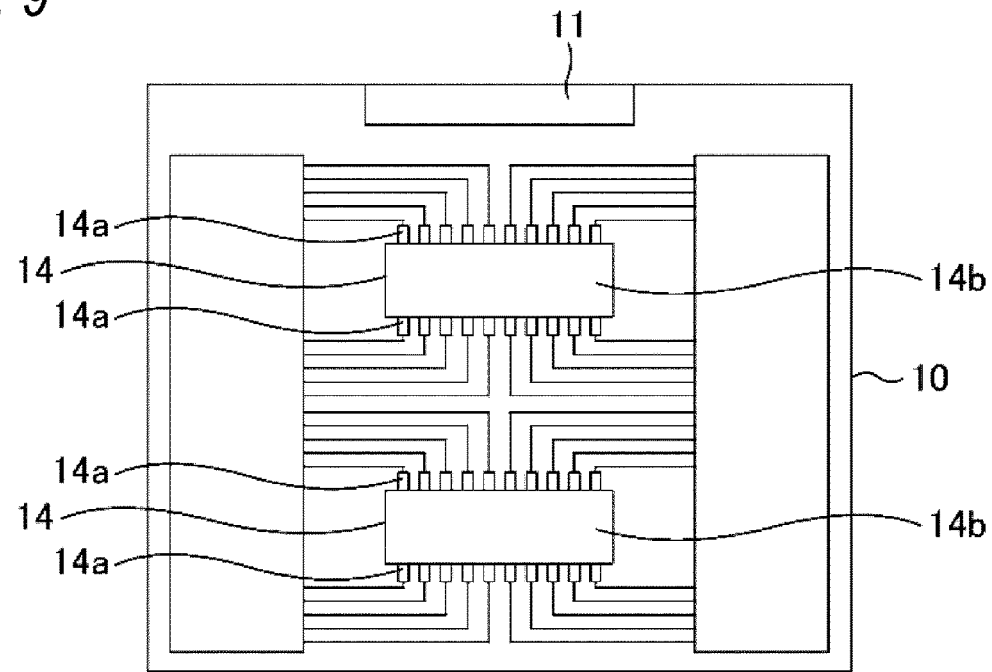
FIG. 9 is a conceptual view showing connector arrangement according to a comparative example.
Figure 10:
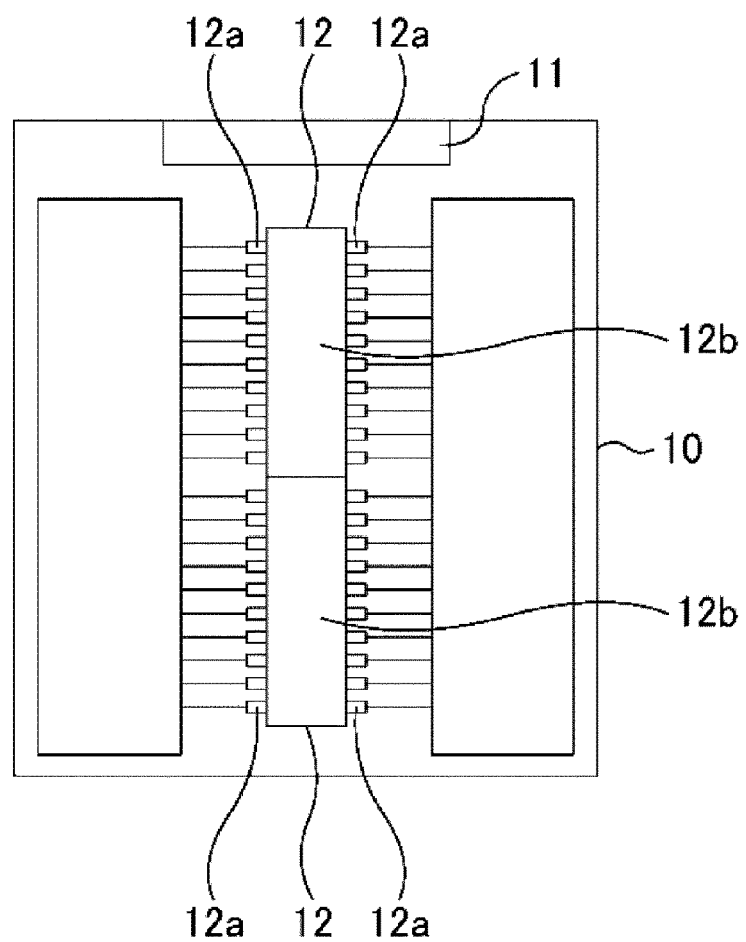
FIG. 10 is a conceptual view showing connector arrangement according to the present embodiment.

FIG. 9 is a conceptual view showing connector arrangement according to a comparative example. FIG. 10 is a conceptual view showing connector arrangement according to the present embodiment.

In the comparative example (FIG. 9), two output connectors 14 are provided. The output connector 14 is a connector corresponding to one of the connection units 12b of the output connector 12, and includes a plurality of (ten on one side) connection terminals 14a and a connection unit 14b. In FIG. 9, each of the two output connectors 14 is provided such that a longitudinal direction of the output connector 14 is parallel to the X direction (a direction along the input region 11), and the plurality of connection terminals 14a are provided along the longitudinal direction (here, the X direction) on both outer sides of the output connector 14 in a transverse direction (here, the Y direction).

In a case of this comparative example (FIG. 9), it is necessary to bend wiring patterns connecting components provided on the substrate 10 and the connection terminals 14a of the output connector 14 as shown in the drawing, and it is difficult to route wirings. Therefore, it is difficult to reduce the substrate size. In FIG. 9, the two output connectors 14 are provided, and when the output connector 12 is provided such that the longitudinal direction of the output connector 12 is along the X direction, similarly, it is also difficult to route the wirings and it is difficult to reduce the substrate size.

On the other hand, in the present embodiment, as shown in FIG. 10, the output connector 12 is provided such that the longitudinal direction of the output connector 12 intersects the side 10A (the input region 11). In the present embodiment, the longitudinal direction of the output connector 12 is orthogonal to the input region 11 (the X direction), but is not limited thereto and may be substantially orthogonal.

Accordingly, the circuits (the lighting circuits and the like) can be provided on both sides of the output connector 12 in the transverse direction (the X direction), and the wirings connecting the components provided on the substrate 10 and the connection terminals 12a of the output connector 12 can be easily routed. Accordingly, wiring efficiency can be improved and the substrate size can be reduced as compared with the comparative example (FIG. 9).

As described above, in FIG. 7, the lighting circuit 3 having the large power consumption is provided on the +X side relative to the dashed-and-dotted line. In this case, as shown in FIG. 10, the lighting circuit 3 can be connected to at least a part of the plurality of connection terminals 12a of the output connector 12 on the +X side. Further, in FIG. 7, the lighting circuits 4 and 5 are provided on the −X side relative to the dashed-and-dotted line. In this case, as shown in FIG. 10, the lighting circuits 4 and 5 can be connected to at least a part of the plurality of connection terminals 12a of the output connector 12 on the −X side. Accordingly, it is possible to improve the wiring efficiency for the three lighting circuits.

The I/F circuits 7A and 7B are provided between the side 10A (the input region 11) and the output connector 12 (see FIG. 7). Accordingly, wirings from the I/F circuits 7A and 7B to the lighting circuits (the lighting circuits 3 to 5) can be formed shorter, and the wiring efficiency can be further improved.

Further, as shown in FIGS. 7 and 8, the output connector 12 and the I/F circuits 7A and 7B are provided on the +Z side surface of the substrate 10. The microcomputer 6, the control circuit IC3 of the lighting circuit 3, the control circuit IC4 of the lighting circuit 4, and the control circuit IC5 of the lighting circuit 5 are provided on the −Z side surface of the substrate 10. Accordingly, the substrate size can be reduced as compared with a case where all the components are provided on the +X side of the substrate 10. Further, a heat dissipation performance can be improved by providing the circuits (the microcomputer 6, the control circuit IC3, the control circuit IC4, and the control circuit IC5) which tend to generate heat in the −Z side surface (a cover 20B side) of the substrate 10.

As described above, the middle point of the side 10A of the substrate 10 is located on the axis (the dashed-and-dotted line) along the Y direction passing through the middle point of the output connector 12 in the transverse direction (here, the X direction). Accordingly, the circuits (the lighting circuits 3 to 5 and the like) can be easily provided on both sides of the output connector 12 in the transverse direction.

SUMMARY

The lighting control apparatus 1 according to the present embodiment has been described above. The lighting control apparatus 1 includes: the lighting circuit 3 which includes the transistors M3B1 and M3B2, the coils L3B1 and L3B2, and the capacitor C3B2 and is configured to generate a drive voltage corresponding to the light source 110 of the vehicle lamp 100 based on the power source voltage Vbat; the substrate 10 on which the lighting circuit 3 is provided; and a cover 20A which is formed of a conductive material and covers at least a part of components of the lighting circuit 3 in a +Z side surface of the substrate 10. The substrate 10 includes the ground portion 13A and the ground portion 13B which are in conductive contact with the cover 20A. The lighting circuit 3 is provided between the ground portion 13A and the ground portion 13B. The capacitor C3B2 is provided in a vicinity of the ground portion 13B. Accordingly, it is possible to reduce noise caused by the lighting circuit 3 having larger power consumption.

The lighting control apparatus 1 may further include the cover 20B which is formed of a conductive material and covers a −Z side surface of the substrate 10. Accordingly, the noise can be reduced or prevented (shielded) even on the −Z side of the substrate 10, and the noise can be reduced on both sides of the substrate 10 in the Z direction.

Further, the coils L3B1 and L3B2 may be provided in the vicinity of the ground portion 13B. Accordingly, the noise can be further reduced.

Further, the lighting circuit 3 may include: the boost circuit 3A which is configured to boost the power source voltage Vbat and the step-down circuit 3B which is configured to step down an output voltage of the boost circuit 3A and generate a drive voltage corresponding to the light source 110. The capacitor C3B2 and the coils L3B1 and L3B2 may be used in the step-down circuit 3B. Accordingly, the noise can be efficiently reduced.

The vicinity of the ground portion 13B may be a range shorter than a distance from the ground portion 13B to the control circuit IC3B (the transistor M3B1 and M3B2). By providing a noise source (the capacitor C3B2) within the range, the noise reduction effect can be improved.

The lighting control apparatus 1 may further include: the lighting circuit 4 which is configured to generate a drive voltage corresponding to the light source 120 having power consumption smaller than that of the light source 110 based on the power source voltage Vbat; and the lighting circuit 5 which is configured to generate a drive voltage corresponding to the light source 130 having power consumption smaller than that of the light source 110 based on the power source voltage Vbat. The ground portion 13A, the ground portion 13B, and the lighting circuit 3 may be provided on a plus side relative to a middle point of the substrate 10 in the X direction, and the lighting circuit 4 and the lighting circuit 5 may be provided on a minus side relative to the middle point of the substrate 10 in the X direction. Accordingly, heat generation can be equalized.

The substrate 10 may further include the ground portion 13C which is in conductive contact with the cover 20A on the minus side in the X direction. The lighting circuit 4 may be provided closer to the ground portion 13C than the lighting circuit 5. A distance between the capacitor C3B2 of the lighting circuit 3 and the ground portion 13B may be smaller than a distance between the capacitor C42 of the lighting circuit 4 and the ground portion 13C. Accordingly, it is possible to improve the arrangement (a degree of freedom of layout) of the lighting circuits 4 and 5 while reducing the noise.

The lighting control apparatus 1 includes: the substrate 10 which has a substantially quadrilateral shape; the output connector 12 which is provided on the substrate 10 and configured to supply power to a light source used in the vehicle lamp 100; and the input region 11 which is provided on the substrate 10 along the side 10A of the substrate 10 and to which the input connector 31 configured to receive an input signal from a vehicle can be attached. The output connector 12 has a longitudinal direction intersecting the input region 11 (the X direction in the present embodiment) and a transverse direction. A plurality of connection terminals 12a are provided along the longitudinal direction on both outer sides of the output connector 12 in the transverse direction. Accordingly, as compared with a case where the output connector 12 is provided such that a longitudinal direction thereof is parallel to the input area (see FIG. 9), wiring efficiency can be improved and a substrate size can be reduced.

The lighting control apparatus 1 may further include: the case 30 which is provided with the input connector 31. In a stat where the substrate 10 is attached to the case 30, the input signal is input to the substrate 10 via the input connector 31. Accordingly, a size of the substrate 10 can be reduced.

The substrate 10 may be provided with the lighting circuit 3 which is configured to light, among light sources included in the vehicle lamp 100, the light source 110 based on the input signal, the lighting circuit 4 which is configured to light the light source 120 having power consumption smaller than that of the light source 110 based on the input signal, and the lighting circuit 5 which is configured to light the light source 130 having power consumption smaller than that of the light source 110 based on the input signal. The lighting circuit 3 may be provided on one side (the +X side) of the output connector 12 in the transverse direction and is connected to at least a part of the plurality of connection terminals 12a on the +X side. The lighting circuit 4 and the lighting circuit 5 may be provided on the other side (the -X side) of the output connector 12 in the transverse direction and may be connected to at least a part of the plurality of connection terminals 12a on the -X side. Accordingly, it is possible to improve the wiring efficiency for the three lighting circuits (the lighting circuits 3, 4, and 5).

The substrate 10 may be provided with the interface circuits 7A and 7B which are configured to receive the input signal, and the interface circuits 7A and 7B may be provided between the side 10A and the output connector 12 in the Y direction (the longitudinal direction of the output connector 12). Accordingly, wirings from the input region 11 to the lighting circuits (the lighting circuits 3 to 5) can be formed shorter, and the wiring efficiency can be further improved.

The lighting control apparatus 1 may further include: the microcomputer 6 which is configured to receive a signal from the I/F circuits 7A and 7B and transmit instructions to the lighting circuits 3, 4, and 5. The lighting circuit 3 may include the control circuit IC3A which is configured to control an operation of the lighting circuit 3 (specifically, the boost circuit 3A) based on an instruction of the microcomputer 6. The lighting circuit 4 may include the control circuit IC4 which is configured to control an operation of the lighting circuit 4 based on an instruction of the microcomputer 6. The lighting circuit 4 may include the control circuit IC5 which is configured to control an operation of the lighting circuit 5 based on an instruction of the microcomputer 6. The output connector 12 and the I/F circuits 7A and 7B may be provided on a +X side surface of the substrate 10. The microcomputer 6, the control circuit IC3A of the lighting circuit 3, the control circuit IC4 of the lighting circuit 4, and the control circuit IC5 of the lighting circuit 5 may be provided on a -X side surface of the substrate 10. Accordingly, the substrate size can be reduced as compared with a case where all the components are provided on the +X side of the substrate 10. Further, a heat dissipation performance can be improved by providing the circuits (the microcomputer 6, the control circuit IC3, the control circuit IC4, and the control circuit IC5) which tend to generate heat in the -Z side surface (a cover 20B side) of the substrate 10.

A middle point of the side 10A in the vicinity of the input region 11 of the substrate 10 may be located on an axis (a dashed-and-dotted line in the drawing) along the Y direction passing through a middle point of the output connector 12 in the transverse direction (here, the X direction). Accordingly, the circuits (the lighting circuits 3 to 5 and the like) can be easily provided on both sides of the output connector 12 in the transverse direction.

The embodiment described above is intended to facilitate understanding of the present disclosure, and is not to be construed as limiting the present disclosure. In addition, it is needless to say that the present disclosure can be changed or improved without departing from the inventive concept thereof, and equivalents thereof are included in the present disclosure.

The present application is based on Japanese Patent Application (Application No. 2021-077428) filed on Apr. 30, 2021 and Japanese Patent Application (Application No. 2021-077429) filed on Apr. 30, 2021, and the contents thereof are incorporated herein by reference.

INDUSTRIAL APPLICABILITY

According to the present disclosure, it is possible to provide a lighting control apparatus capable of reducing noise. Further, according to the present disclosure, it is possible to provide a lighting control apparatus capable of improving wiring efficiency and reducing a substrate size.

REFERENCE SIGNS LIST 1 lighting control apparatus
2 power source circuit 3 lighting circuit
3A boost circuit
3B step-down circuit
4 lighting circuit
5 lighting circuit
6 microcomputer
7A, 7B, 7C I/F circuit
8 power supply circuit
10 substrate
10A, 10B, 10C, 10D side
11 input region
12 output connector
12a connection terminal
12b connection unit
13A, 13B, 13C ground portion
14 output connector
14a connection terminal
14b connection unit
20A, 20B cover
22 opening
23A, 23B, 23C connection piece
24 engagement hole
30 case
31 input connector
32 cylindrical opening
34 engagement protrusion
41 screw
42 heat transfer sheet
100 vehicle lamp
100A light source unit
101 switch circuit
110 light source
120 light source
130 light source
200 battery
300 vehicle-side harness
310 connector
400 lamp-side harness
410 connector
D1_1 to D1_N, D2, D3 light-emitting element
SW1 to SWN switch
Vbat power source voltage
D3A diode
C3A1, C3A2, C3B, C41, C42, C51, C52 capacitor
L3A, L3B1, L3B2, L4, L5 coil
R3A1, R3A2, R3B, R4, R5 resistor
IC3A, IC3B, IC4, IC5 control circuit
M3A, M3B1, M3B2, M41 to M44, M51 to M54 transistor

The invention claimed is:

1. A lighting control apparatus configured to be applied to a vehicle lamp, the lighting control apparatus comprising:
a first switching converter which includes:
a switching element,
a coil, and
a first output capacitor, wherein the first output capacitor is configured to generate a first drive voltage corresponding to a first light source of the vehicle lamp based on a power source voltage;
a substrate on which the first switching converter is provided;
a first cover which is formed of a conductive material and covers at least a part of components of the first switching converter in one surface of the substrate; and
an input connector and an output connector that are mounted to the substrate;
wherein the substrate includes a first conduction part and a second conduction part which are in conductive contact with the first cover;
wherein the first switching converter is provided between the first conduction part and the second conduction part;
wherein the input connector is provided in a vicinity of the first conduction part; and
wherein the first output capacitor and the output connector are provided in a vicinity of the second conduction part.

2. The lighting control apparatus according to claim 1, further comprising a second cover which is formed of a conductive material and covers other surface of the substrate.

3. The lighting control apparatus according to claim 1, wherein the coil is provided in the vicinity of one part of the first conduction part.

4. The lighting control apparatus according to claim 3, wherein the first switching converter includes:
a boost circuit which is configured to boost the power source voltage and
a step-down circuit which is configured to step down an output voltage of the boost circuit and generate the first drive voltage; and
wherein the first output capacitor and the coil are used in the step-down circuit.

5. The lighting control apparatus according to claim 1, wherein the vicinity of one part of the first conduction part is a range shorter than a distance from one part of the first conduction part to the switching element.

6. The lighting control apparatus according to claim 1, further comprising:
a second switching converter which is configured to generate a second drive voltage corresponding to a second light source of the vehicle lamp having power consumption smaller than that of the first light source, based on the power source voltage; and
a third switching converter which is configured to generate a third drive voltage corresponding to a third light source of the vehicle lamp having power consumption smaller than that of the first light source, based on the power source voltage,
wherein the first conduction part, the second conduction part, and the first switching converter are provided on one side of the substrate in a predetermined direction, and
wherein the second switching converter and the third switching converter are provided on other side of the substrate in the predetermined direction.

7. The lighting control apparatus according to claim 6,
wherein the substrate includes a third conduction part which is in conductive contact with the first cover on the other side in the predetermined direction,
wherein the second switching converter is provided closer to the third conduction part than the third switching converter, and
wherein a first distance between the first output capacitor of the first switching converter and one part of the first conduction part is smaller than a second distance between a second output capacitor of the second switching converter and the third conduction part.

8. The lighting control apparatus according to claim 1, wherein a ground line of a ground level voltage from a battery of a vehicle is connected to the first conduction part via the input connector.

9. A lighting control apparatus configured to be applied to a vehicle lamp, the lighting control apparatus comprising:

a substrate which has a substantially quadrilateral shape;

a first connector which is provided on the substrate and configured to supply power to a light source used in the vehicle lamp;

an input region which is provided on the substrate along a predetermined side of the substrate, wherein a second connector configured to receive an input signal from a vehicle can be attached to the input region; and lighting circuits configured to light the light source;

wherein the first connector has a longitudinal direction intersecting the input region and a transverse direction;

wherein a plurality of connection terminals are provided along the longitudinal direction on both outer sides of the first connector in the transverse direction; and wherein at least one of the lighting circuits is provided on each one of the outer sides of the first connector in the transverse direction.

10. The lighting control apparatus according to claim 9, further comprising:

a housing which is provided with the second connector, wherein in a state where the substrate is attached to the housing, the input signal is configured to be input to the substrate via the second connector.

11. The lighting control apparatus according to claim 9, wherein the substrate is provided with:

a first lighting circuit which is configured to light, among first to third light emission units included in the light source, the first light emission unit based on the input signal, a second lighting circuit which is configured to light the second light emission unit having power consumption smaller than that of the first light emission unit based on the input signal, and a third lighting circuit which is configured to light the third light emission unit having power consumption smaller than that of the first light emission unit based on the input signal, wherein the first lighting circuit is provided on one side of the first connector in the transverse direction and is connected to at least a part of the plurality of connection terminals on the one side, and wherein the second lighting circuit and the third lighting circuit are provided on other side of the first connector in the transverse direction and are connected to at least a part of the plurality of connection terminals on the other side.

12. The lighting control apparatus according to claim 11, wherein the substrate is provided with an interface circuit which is configured to receive the input signal, and wherein the interface circuit is provided between the predetermined side and the first connector in the longitudinal direction.

13. The lighting control apparatus according to claim 12, further comprising:

an instruction circuit which is configured to receive a signal from the interface circuit and transmit instructions to the first to third lighting circuits, wherein the first lighting circuit includes a first control circuit which is configured to control an operation of the first lighting circuit based on an instruction of the instruction circuit, wherein the second lighting circuit includes a second control circuit which is configured to control an operation of the second lighting circuit based on an instruction of the instruction circuit, wherein the third lighting circuit includes a third control circuit which is configured to control an operation of the third lighting circuit based on an instruction of the instruction circuit, and wherein the instruction circuit and the first to third control circuits are provided on a surface of the substrate on a side opposite to a surface on which the first connector and the interface circuit are provided.

14. The lighting control apparatus according to claim 9, wherein a middle point of the predetermined side of the substrate is located on an axis along the longitudinal direction passing through a middle point of the first connector in the transverse direction.

* * * * *